US008298908B2

(12) United States Patent
Dube et al.

(10) Patent No.: US 8,298,908 B2
(45) Date of Patent: Oct. 30, 2012

(54) STRUCTURE AND METHOD FOR FORMING ISOLATION AND BURIED PLATE FOR TRENCH CAPACITOR

(75) Inventors: Abhishek Dube, Hopewell Junction, NY (US); Subramanian S. Iyer, Hopewell Junction, NY (US); Babar Ali Khan, Hopewell Junction, NY (US); Oh-jung Kwon, Hopewell Junction, NY (US); Junedong Lee, Hopewell Junction, NY (US); Paul C. Parries, Hopewell Junction, NY (US); Chengwen Pei, Hopewell Junction, NY (US); Gerd Pfeiffer, Hopewell Junction, NY (US); Ravi M. Todi, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 12/704,084

(22) Filed: Feb. 11, 2010

(65) Prior Publication Data

US 2011/0193193 A1 Aug. 11, 2011

(51) Int. Cl.
*H01L 21/20* (2006.01)
(52) U.S. Cl. .................. 438/391; 257/E21.008
(58) Field of Classification Search .................. 438/391; 257/E21.008
See application file for complete search history.

(56) References Cited

U.S. PATENT DOCUMENTS

| | | | | |
|---|---|---|---|---|
| 5,959,322 | A * | 9/1999 | Lee | 257/298 |
| 6,544,838 | B2 * | 4/2003 | Ranade et al. | 438/244 |
| 6,930,004 | B2 * | 8/2005 | Wang et al. | 438/268 |
| 7,049,202 | B2 * | 5/2006 | Kitamura | 438/390 |
| 7,067,396 | B2 * | 6/2006 | Aspar et al. | 438/459 |
| 7,078,756 | B2 * | 7/2006 | Otani et al. | 257/296 |
| 7,445,987 | B2 * | 11/2008 | Cheng et al. | 438/243 |
| 8,101,494 | B2 * | 1/2012 | Collins et al. | 438/386 |
| 8,110,862 | B2 * | 2/2012 | Cheng et al. | 257/301 |
| 8,193,067 | B2 * | 6/2012 | Anderson et al. | 438/391 |
| 2005/0224852 | A1 * | 10/2005 | Cheng et al. | 257/296 |
| 2006/0105526 | A1 * | 5/2006 | Kwon et al. | 438/268 |
| 2006/0118850 | A1 * | 6/2006 | Otani et al. | 257/301 |
| 2006/0124982 | A1 * | 6/2006 | Ho et al. | 257/304 |
| 2007/0224757 | A1 * | 9/2007 | Cheng et al. | 438/243 |
| 2007/0254430 | A1 * | 11/2007 | Cheng | 438/243 |
| 2008/0185680 | A1 * | 8/2008 | Cheng et al. | 257/532 |
| 2008/0242021 | A1 * | 10/2008 | Kwon et al. | 438/243 |
| 2009/0184356 | A1 * | 7/2009 | Brodsky et al. | 257/301 |
| 2012/0161215 | A1 * | 6/2012 | Lindert | 257/296 |

* cited by examiner

*Primary Examiner* — N Drew Richards
*Assistant Examiner* — Grant Withers
(74) *Attorney, Agent, or Firm* — Joseph P. Abate; Howard M. Cohn

(57) ABSTRACT

A structure and method for forming isolation and a buried plate for a trench capacitor is disclosed. Embodiments of the structure comprise an epitaxial layer serving as the buried plate, and a bounded deep trench isolation area serving to isolate one or more deep trench structures. Embodiments of the method comprise angular implanting of the deep trench isolation area to form a P region at the base of the deep trench isolation area that serves as an anti-punch through implant.

14 Claims, 6 Drawing Sheets

STRUCTURE AND METHOD FOR FORMING ISOLATION AND BURIED PLATE FOR TRENCH CAPACITOR

FIELD OF THE INVENTION

The present invention relates generally to a method of fabricating a semiconductor device. More particularly, the present invention relates to a method of fabricating a trench capacitor that can be formed in a dynamic random access memory cell.

BACKGROUND OF THE INVENTION

Trench capacitors are widely used in Dynamic Random Access Memory (DRAM) devices for data storage. A trench DRAM cell consists of a trench capacitor and a transistor. The trench capacitor typically consists of a hole etched into the substrate, a first electrode—often referred as a "buried plate"—in the substrate, a second electrode in the trench, and a thin storage-node dielectric which separates those two electrodes. The transistor is formed above the trench capacitor.

Deep trench capacitors can also be used as decoupling capacitors which can stabilize the voltage level across the chip and significantly improve chip performance. The buried plates of deep trenches used for different purposes may require different biases to operate, thus, different buried plate regions need to be isolated from each other.

A buried plate is formed in the substrate adjacent the trench by out-diffusing a dopant such as arsenic (As) into the substrate. Buried plate doping may be formed by conventional solid phase doping processes such as out-diffusing arsenic from a layer of arsenic-doped silicon glass (ASG) on trench sidewall, liquid phase doping, gas phase doping (GPD), plasma doping, plasma immersion ion implantation, infusion doping, or any combination of these methods that are well known in prior art.

However, as consumers are demanding products with more processing power, and smaller physical size, there is a need to improve the performance of various integrated circuits, such as DRAM devices. This is driving a trend towards smaller and smaller dimensions. As the trend towards miniaturization continues, the aforementioned prior art method for forming the buried plate have drawbacks, such as being limited by the aspect ratio (AR) of the trench, and requiring a sidewall spacer. Therefore, it is needed to have an improved method for fabricating a trench capacitor that is suitable for smaller technologies, which provides the high performance and small size demanded by today's electronic devices.

SUMMARY

In one embodiment of the present invention, a method is provided for fabricating a trench capacitor. The method comprises the steps of: growing an epitaxial layer on a silicon substrate; forming a BOX layer above the epitaxial layer; forming a SOI layer above the BOX layer; depositing a nitride layer above the SOI layer; depositing a mask layer above the nitride layer; etching a deep trench within the epitaxial layer; and etching a bounded deep trench isolation moat within the epitaxial layer, wherein the base of the deep trench isolation moat extends into the epitaxial layer, and extends into the silicon substrate, wherein a first N doped region of the epitaxial layer is formed within the bounded deep trench isolation moat, and a second N doped region of the epitaxial layer is formed outside the bounded deep trench isolation moat, wherein the deep trench is within the bounded deep trench isolation area, and wherein the width of the deep trench isolation moat is at least one order of magnitude larger than the width of the deep trench.

In another embodiment of the present invention, a semiconductor structure is provided, which comprises: a silicon substrate; an N+ epitaxial layer disposed above the silicon substrate; a BOX layer disposed above the epitaxial layer; a SOI layer disposed above the BOX layer; a deep trench isolation moat formed in the epitaxial layer, wherein the deep trench isolation moat extends into the silicon substrate, thereby forming a bounded area of the; a deep trench, the deep trench oriented within the bounded area of the deep trench isolation moat; and wherein the width of the deep trench isolation moat is at least one order of magnitude larger than the width of the deep trench.

In another embodiment of the present invention, a semiconductor structure is provided, which comprises: a silicon substrate; an N+ epitaxial layer disposed above the silicon substrate; a BOX layer disposed above the epitaxial layer; a SOI layer disposed above the BOX layer; a deep trench isolation moat formed in the epitaxial layer, wherein the deep trench isolation moat extends into the silicon substrate, thereby forming a bounded area of the deep trench isolation moat; a plurality of deep trenches, each deep trench oriented within the bounded area of the deep trench isolation moat, wherein a p+ anti-punch through implant is formed at the base of the deep trench isolation moat, and wherein the width of the deep trench isolation moat is at least one order of magnitude larger than the width of each deep trench.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a semiconductor structure after a preliminary fabrication step.

FIG. 2 shows a semiconductor structure after etching of the deep trench and deep trench isolation region.

FIG. 3 shows diffusion effects on the semiconductor structure of FIG. 2.

FIG. 4A is a top down schematic view of the semiconductor structure of FIG. 2.

FIG. 4B is a top down schematic view of an alternate embodiment of a semiconductor structure.

FIG. 5 is a top down schematic view of a semiconductor structure after a mask process step in an alternate embodiment of the present invention.

FIG. 6 shows a semiconductor structure cross section of the deep trench isolation region during an implant process step in an alternate embodiment of the present invention.

FIG. 7 shows an additional cross section view of the semiconductor structure during the process step shown in FIG. 6.

FIG. 8 shows an additional cross section view of the semiconductor structure after a subsequent processing step.

FIG. 9 shows a flowchart indicating process steps for carrying out an embodiment of the present invention.

FIG. 10 shows a flowchart indicating process steps for carrying out an alternate embodiment of the present invention.

DETAILED DESCRIPTION

The prior art method of fabricating a trench bottom plate via implant is effective in previous technologies (e.g. >45 nm). However, as semiconductor fabrication continues to progress towards smaller dimensions, new structures and methods are needed to provide improved performance and manufacturability. The prior art methods are strongly limited by trench aspect ratio (AR) and sidewall spacer requirements, which make these methods unfeasible for smaller dimensions. Embodiments of the present invention disclosed herein provide improved methods and structures for the fabrication of trench capacitors at smaller dimensions.

Figure 1:
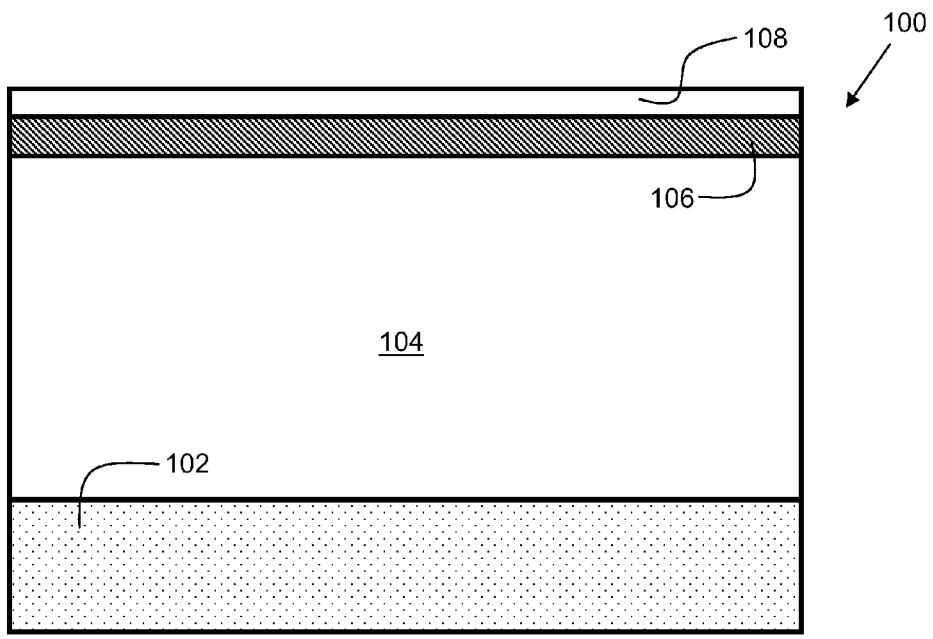

FIG. 1 shows a semiconductor structure 100 at the starting point of the inventive process. Structure 100 is comprised of silicon substrate 102, and epitaxial N+ doped single crystal silicon layer 104, hereinafter referred to as "EPI," is disposed above silicon substrate 102. EPI layer 104 is in-situ doped, meaning that N+ dopants are introduced in the EPI layer 104 as it is grown. When the fabrication is complete, portions of the EPI layer 104 will serve as the plate for trench capacitors. Above EPI layer 104 is buried oxide layer (BOX) 106. Above BOX layer 106 is silicon-on-insulator (SOI) layer 108. In one embodiment, EPI layer 104 ranges from about 3 micrometers (μm) to about 5 micrometers in thickness. In one embodiment, BOX layer 106 ranges from about 100 nm to about 200 nm in thickness. In another embodiment, BOX layer 106 is 150 nm thick. In one embodiment, SOI layer 108 ranges from about 50 nm to about 100 nm in thickness. In another embodiment, SOI layer 108 is 75 nm to 85 nm thick and preferably 80 nm thick. BOX layer 106 is formed by thermal oxidation, and SOI layer 108 is formed by a process of bonding and splitting of wafers. SOI substrate fabrication is known in the industry, and is the subject of U.S. Pat. No. 7,067,396, to Aspar, et al., entitled "Method of producing a thin layer of semiconductor material," and is incorporated in its entirety herein by reference.

Figure 2:
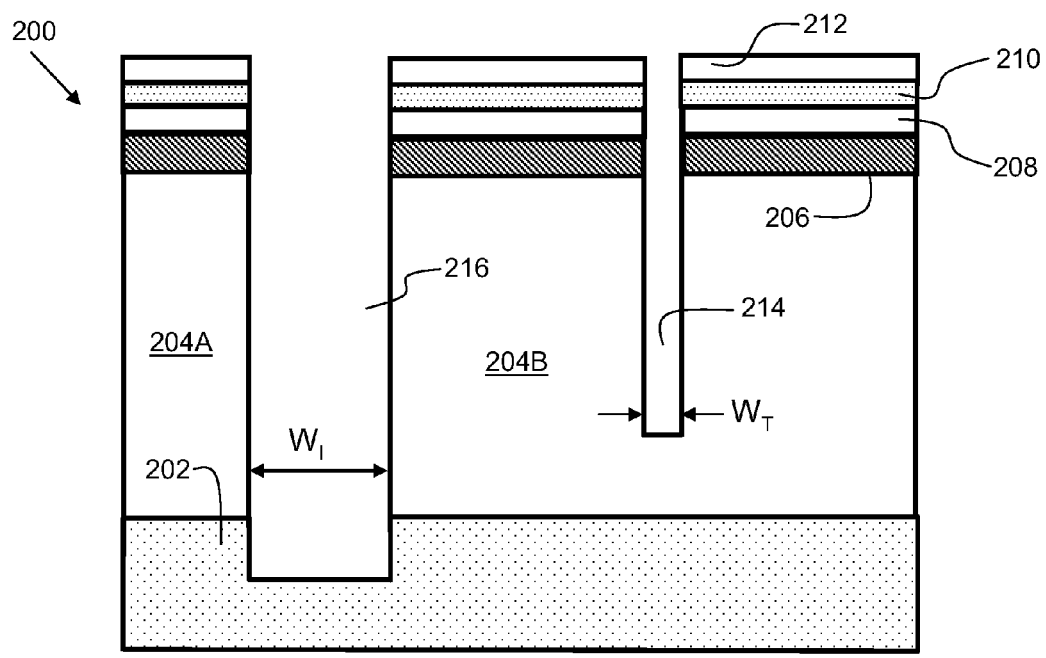

FIG. 2 shows semiconductor structure 200, at a subsequent step in the fabrication process, after various sub-steps have been performed. As stated previously in this disclosure, similar elements may be referred to by similar numbers in various figures (FIGs) of the drawing, in which case typically the last two significant digits may be the same. For example, BOX layer 106 and SOI layer 108 of FIG. 1 are similar to BOX layer 206 and SOI layer 108 of FIG. 2. The structure 200 has nitride layer 210 and mask layer 212 applied above SOI layer 208. In one embodiment, the mask is a high-density plasma (HDP) oxide.

Deep Trench (DT) 214 is etched into the substrate to a depth of $X_T$, and has a width of $W_T$. DT 214 forms the trench capacitor when fabrication is complete. As mentioned before, the trend of miniaturization and the functionality of the trench capacitor require them to occupy the smallest possible area but offer the highest possible capacitance. As a result, these deep trenches are routinely driven to maximum depth allowed by manufacturing equipment and techniques available for a certain technology node. Consequently, the buried plate is required to reach same depth as deep trenches to avoid plate depletion effect and capacitance loss. Due to diffusion, the depth of the n-type doping would always be deeper than the cell deep trenches. Thus it is difficult to isolate the buried plate regions even with a separate masked deep trench RIE process. In one embodiment, deep trench (DT) 214 has a width ranging from about 80 nanometers to about 120 nanometers, and a depth of at least 3 micrometers.

Deep Trench Isolation (DTI) 216 is etched into the substrate to a depth of $X_I$, and has a width of $W_I$. The aspect ratio (AR) of a trench is defined is X/W, where X is the depth, and W is the width of the trench. Trench depth is limited by aspect ratio, among other factors. We take advantage of this characteristic by design the DTI width $W_I$ to be larger than $W_T$. As a result, these wider DTI structures etch deeper, and extend into substrate 202, serving to provide isolation for DT 214. DTI 216 is a bounded structure, having a closed shape such as an approximately rectangular shape, and serves as a so-called "isolation moat" that provides isolation for the DT 214. DTI 216 is referred to as a deep trench isolation moat.

$X_I$ is larger than $X_T$, and DTI 216 extends into silicon substrate 202 which has been doped P−, serving to electrically isolate N doped region 204A from N doped region 204B. While $X_I$ is larger than $X_T$, both dimensions are of the same order of magnitude. For example, in one embodiment, $X_T$ is about 4 μm, and $X_I$ is about 6 μm. However, $W_I$ is much larger than $W_T$. For example, in one embodiment, $W_T$ is about 100 nm, and $W_I$ is about 0.5 μm, which is 5 times larger. Therefore:

$$AR(DT) \gg AR(DTI)$$

Embodiments of the present invention take advantage of the fact that the aspect ratio of the deep trench (DT) is much greater than the aspect ratio of the deep trench isolation (DTI) during the fabrication process. In one embodiment, DTI 216 has a width of at least 1 micrometer, and a depth of at least 4 micrometers.

Figure 3:
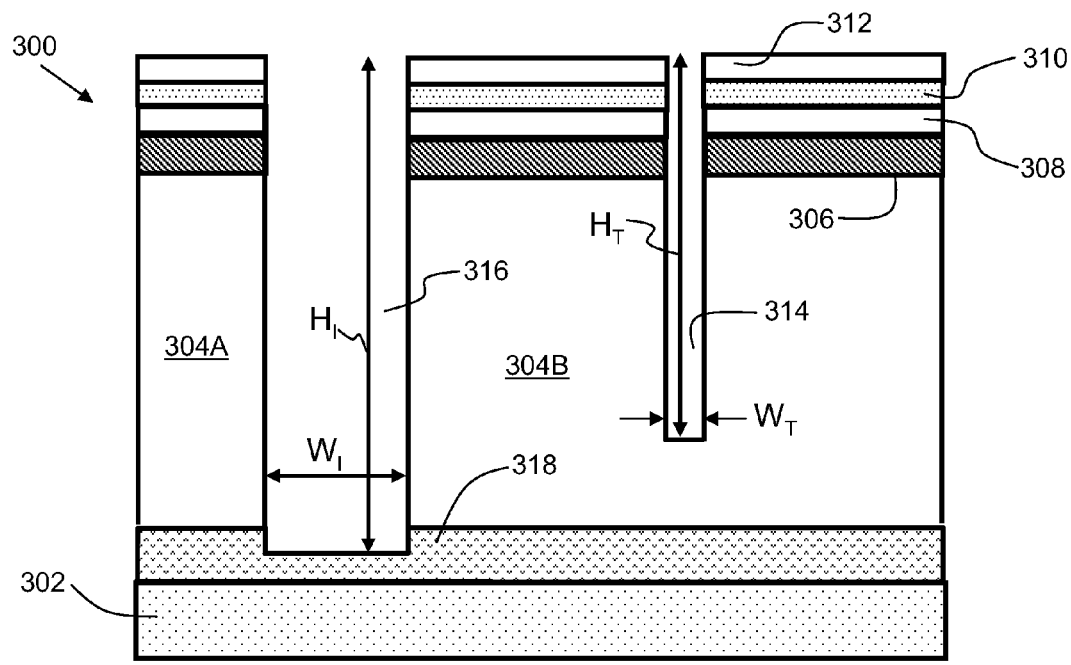

FIG. 3 shows a structure 300 after s subsequent annealing step. The anneal causes dopants from the N+ EPI regions (304A and 304B) to diffuse into the P region substrate (202 of FIG. 2), forming diffusing layer 318. Due to the extremely low p-type doping level of substrate 202 disposed below N+ EPI regions (304A and 304B), and significant thermal budget during SOI substrate formation as well as during the chip fabrication process, the EPI N+ dopants are expected to diffuse down into the p-substrate forming diffusing layer 318. As a result, even the significantly deeper DTI 316 may not provide sufficient isolation.

If the diffusion layer extends below the base 316B of DTI 316, then N+ EPI region 304A is shorted to N+ EPI region 304B, and the semiconductor integrated circuit (IC) that is formed once all fabrication steps are completed will be compromised. Embodiments of the present invention provide for sufficient isolation, even in the presence of a diffusion layer 318.

Figure 4A:
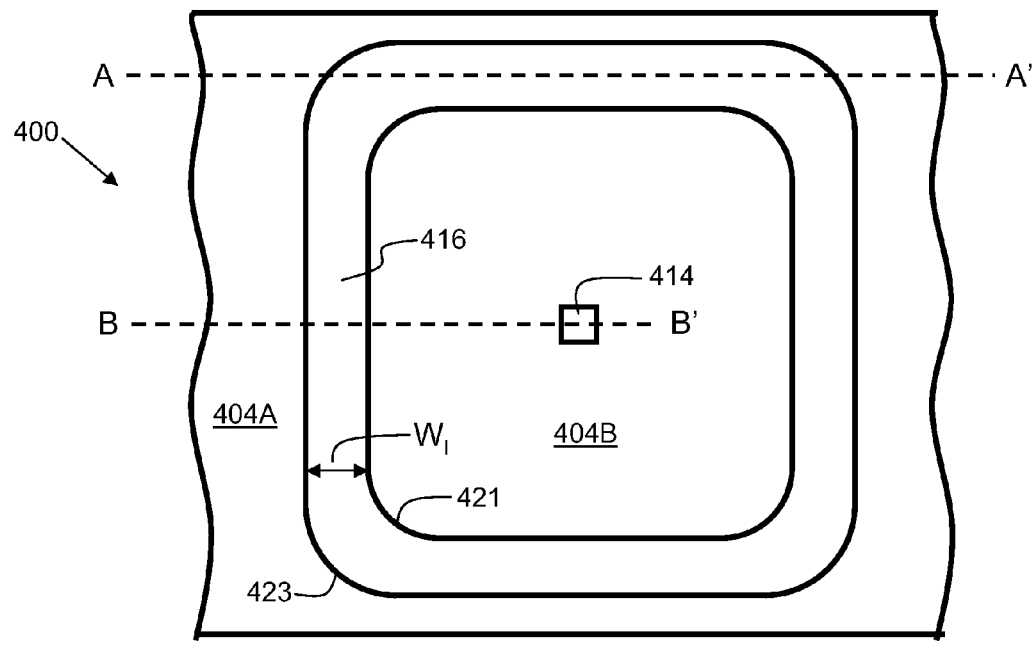

FIG. 4A shows a top-down view of a structure 400, which is similar to structure 300 of FIG. 3. The top-down view is provided to support subsequent figures illustrating cross-sectional views along lines A-A', and B-B'. In FIG. 4, DT 414 is shown within N region 404B. DTI 416 surrounds N region 404B, and electrically isolates it from N region 404A, provided that the diffusion layer (318, FIG. 3) does not extend below the base of DTI 416. In this view, it can be seen that DTI 416 is a bounded shape, and region 404B is a bounded area of the DTI 416, referred to as the bounded deep trench isolation area. The DT 414 is therefore located within the bounded deep trench isolation area.

The DTI preferably has rounded interior corners 421 and similarly rounded exterior corners 423, as opposed to sharp, squared-off corners. Avoiding sharp corners helps to maintain the integrity of dielectric films that are used in the DTI. The width $W_I$ is preferably kept constant around the perimeter of the DTI 416, which provides for a consistent depth of DTI 416 after the etch process is complete. Note that while only a single DT 414 is shown in FIG. 4A, in most cases, the DTI is intended to isolate multiple DTs that comprise a sub-circuit requiring isolation, as is shown in FIG. 4B.

Figure 4B:
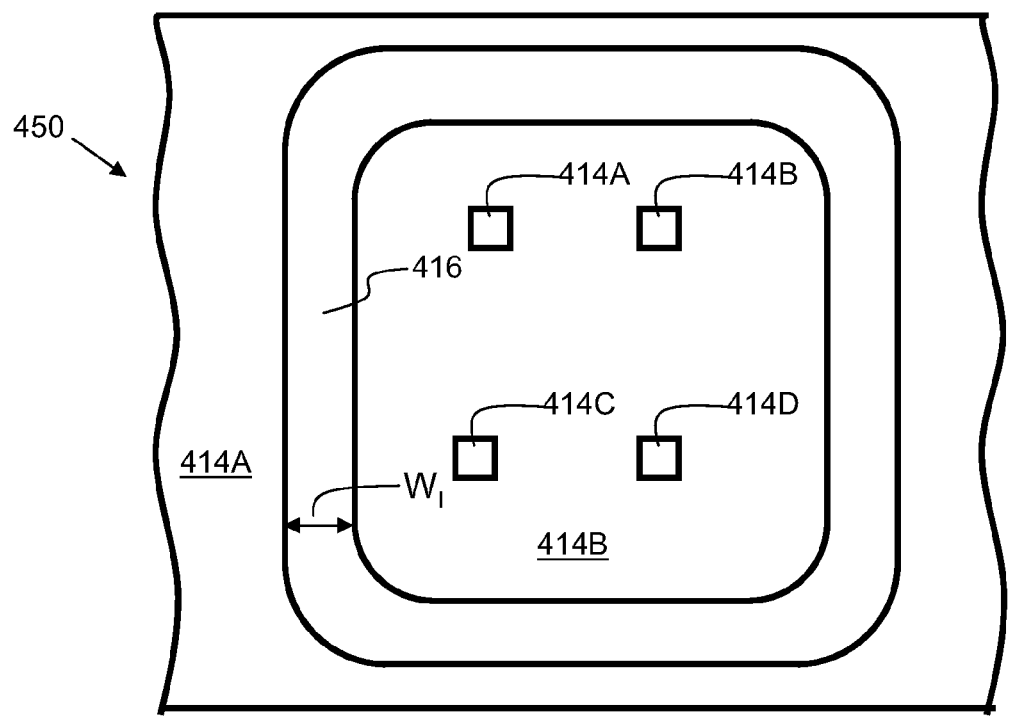

FIG. 4B is a top down schematic view of an alternate embodiment of a semiconductor structure 450. In this structure, DTI 416 surrounds a plurality of DT structures (414A-414D).

Figure 5:
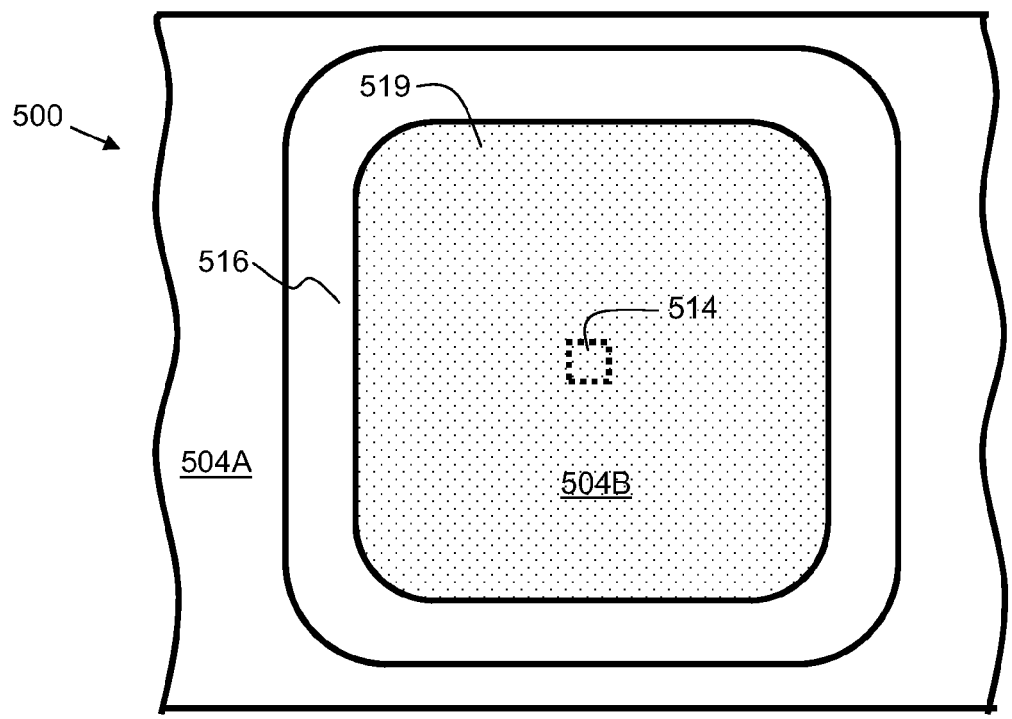

FIG. 5 shows a subsequent processing step in one embodiment of the present invention. In this embodiment, a mask 519 is deposited over N region 504B. Then, P dopants are implanted in DTI 516. The P dopants provide additional isolation, even if the diffusion layer (318, FIG. 3) extends below the base of DTI 516. However, the application of the mask 519 adds process steps to the fabrication process. Another embodiment of the present invention provides for dopants to be implanted in the DTI without the need for the mask, as explained in FIG. 6.

Figure 6:
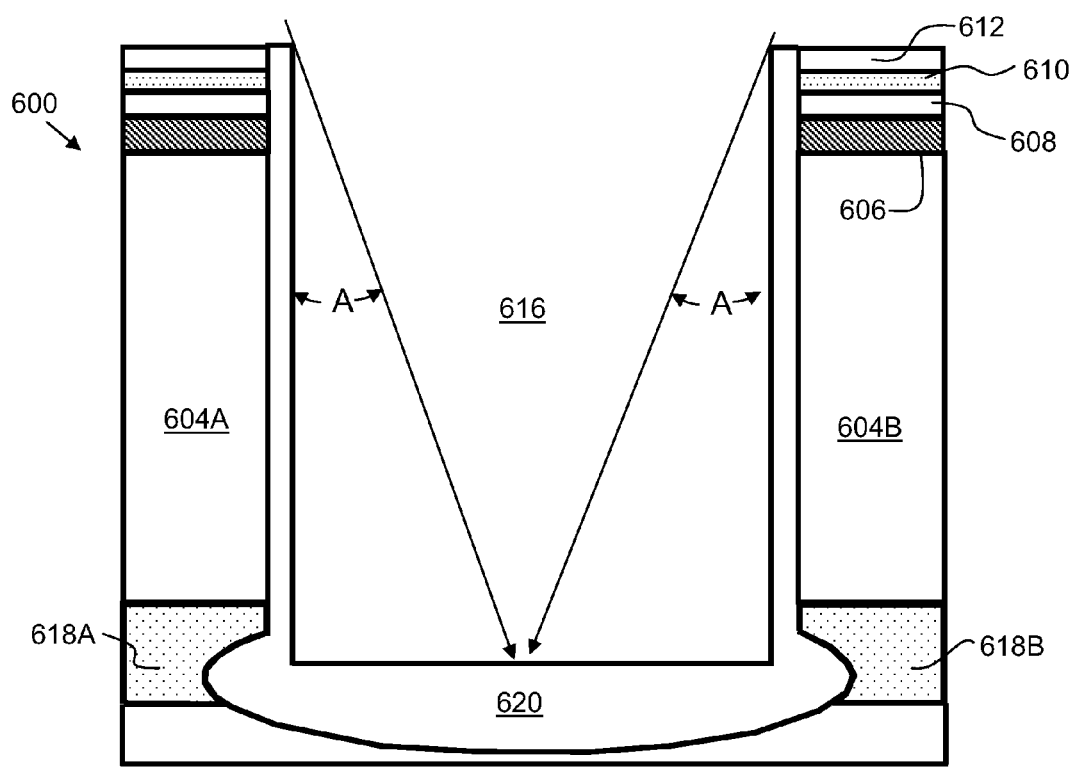

FIG. 6 shows a cross-sectional view of a structure 600, which is similar to structure 400 of FIG. 4. The cross-sectional view of FIG. 6 is taken along line A-A' of FIG. 4. The DTI 616 is P dopant implanted with an implanting tool, such as those manufactured by Varian or Axcelis. The implanting occurs at angle A, and is sent from various directions. In FIG. 6, two implanting paths are shown ($I_X$ and $I_Y$). However, in practice, multiple implanting paths are used, providing thorough coverage of the DTI area. The result of the P dopant implanting forms P+ region 620 at the base of DTI 616, which acts as an "anti-punch through" implant that effectively "severs" the diffusion layer into two separate parts (618A and 618B, compare with diffusion layer 318 of FIG. 3). Angle A preferably is in the range of about 19 degrees to about 80 degrees. In one embodiment, angle A has a range of about 20 degrees to about 25 degrees. The angle value used depends on various factors, such as the physical dimensions of the deep trench, deep trench isolation, and various top layers (such as nitride and mask). The implanting angle A that will substantially prevent dopants from entering the DT can then be calculated by calculating the inverse tangent of the ratio of the width of the deep trench 614 to the combined thickness of the nitride layer 610 and the mask layer 612, and is shown as:

$$a\tan(W_T/(M_T+N_T))$$

Where $M_T$ is the thickness of the mask layer, $N_T$ is the thickness of the nitride layer, and $W_T$ is the width of the deep trench (DT). In one embodiment, the thickness of the nitride layer ranges from about 100 nm to about 150 nm, and the mask layer thickness ranges from about 150 nm to about 1500 nm.

In a specific embodiment, the width of the deep trench (see $W_T$ of FIG. 3) is 100 nm, the thickness of the nitride layer (see 310 of FIG. 3) is 120 nm, and the thickness of the mask layer (see 312 of FIG. 3) is 180 nm. Using the aforementioned formula, the appropriate angle value is calculated as:

a tan(100/(120+180)=a tan (0.333)=18.4 degrees, which, when rounded up to the next highest degree value, is 19 degrees. If the angle value is too low, then P dopants can undesirably enter the sidewall of the deep trench (314 of FIG. 3). If the angle value is too high, then the concentration of P dopants that penetrates the diffusion layer (see 318 of FIG. 3) may be insufficient to provide electric isolation.

Figure 7:
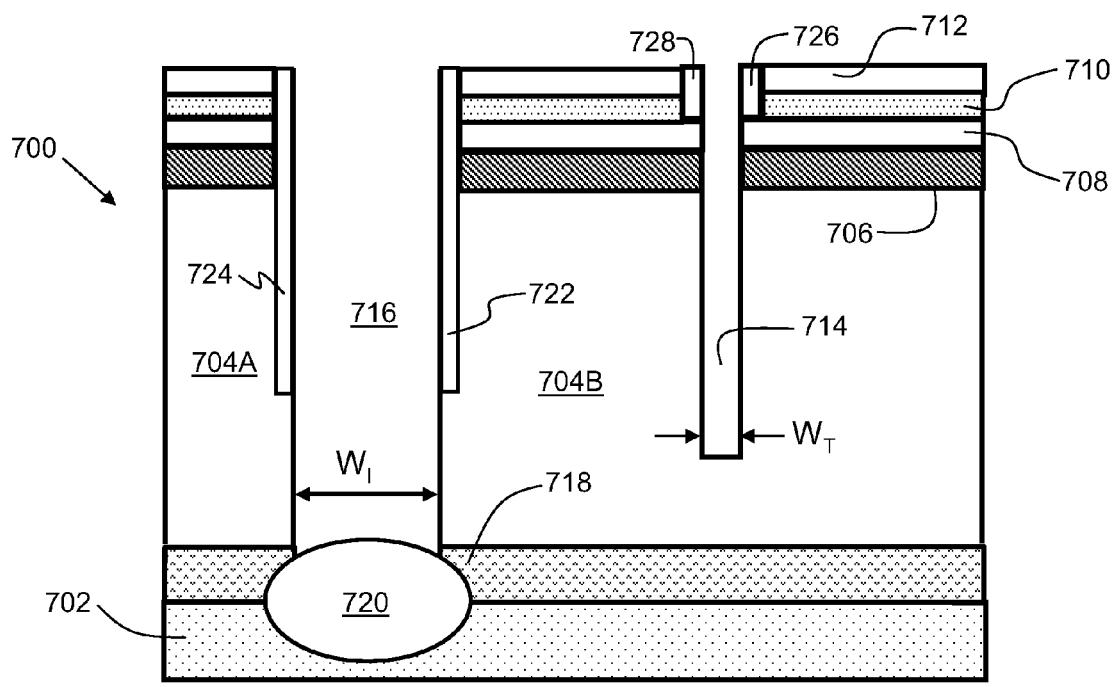

FIG. 7 shows a cross-sectional view of a structure 700, which is similar to structure 400 of FIG. 4. The cross-sectional view of FIG. 7 is taken along line B-B' of FIG. 4. In this view, implantation paths $I_Z$ and $I_W$ are shown. Each implantation path has angle A. As stated previously, since the width $W_T$ of DT 714 is orders of magnitude less than the width $W_I$ of DTI 718, the aspect ratio (AR) of the DT 714 is orders of magnitude greater than the AR of DTI 718. Small P doped regions 726 and 728 are formed as a result of the angular implantation. However, the large aspect ratio of DT 714 effectively prevents dopants from entering the DT beyond the mask layer 712 and nitride layer 710. The angular implantation also creates P doped regions 724 and 722, along the sidewalls of DTI 716. These P doped regions do not have an adverse affect on the isolating properties of DTI 716.

Figure 8:
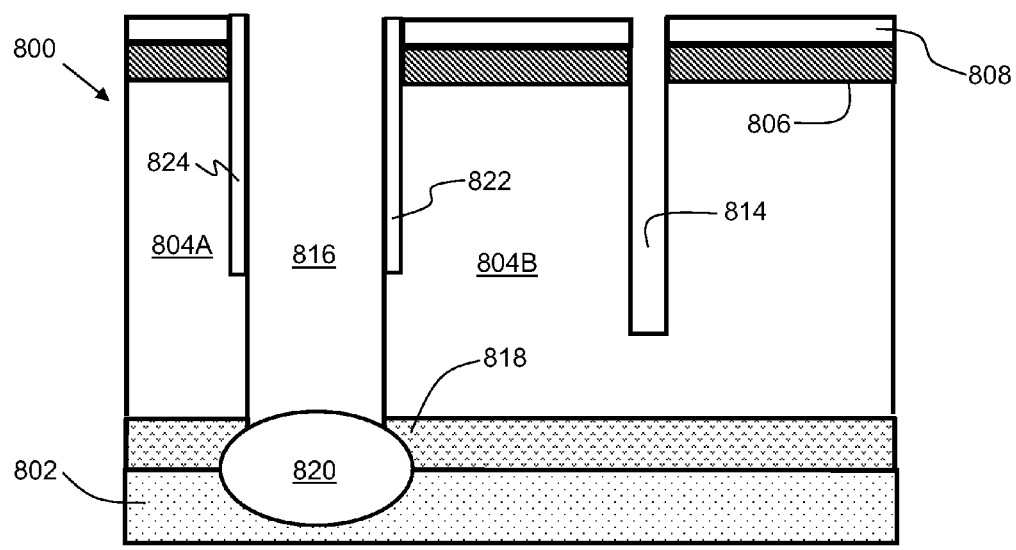

FIG. 8 shows a cross-sectional view of a structure 800, which is similar to structure 700 of FIG. 7. The cross-sectional view of FIG. 8 is taken along line B-B' of FIG. 4. After a subsequent processing step, layers 710 and 712 (see FIG. 7), along with P doped regions 726 and 728 (see FIG. 7) are removed, thereby leaving DT 814 unaffected by the angular implantation that was shown in FIG. 7

Figure 9:
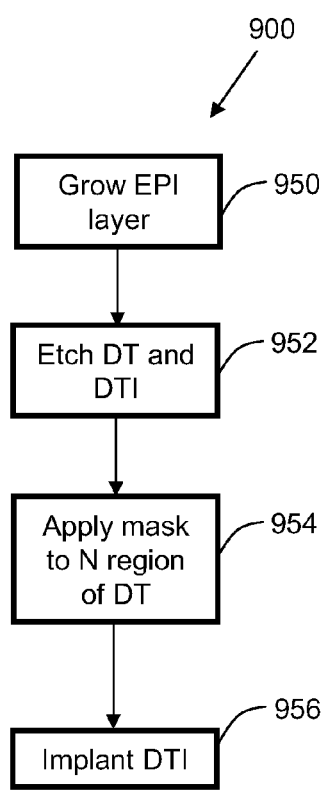

FIG. 9 shows a flowchart 900 indicating process steps for carrying out an embodiment of the present invention. At process step 950, an EPI layer is grown on a silicon substrate. At process step 952, the DT and DTI are formed via etch. In one embodiment, a reactive ion etch (RIE) tool is used to perform the etch. In process step 954, a mask is applied to the N region of the DT (see 519 of FIG. 5). In process step 956, the DTI is implanted. Since the mask is applied in step 954, which protects the DT, an angle of 0 degrees (refer to angle A in FIG. 6) can be used for the implant performed at step 956.

Figure 10:
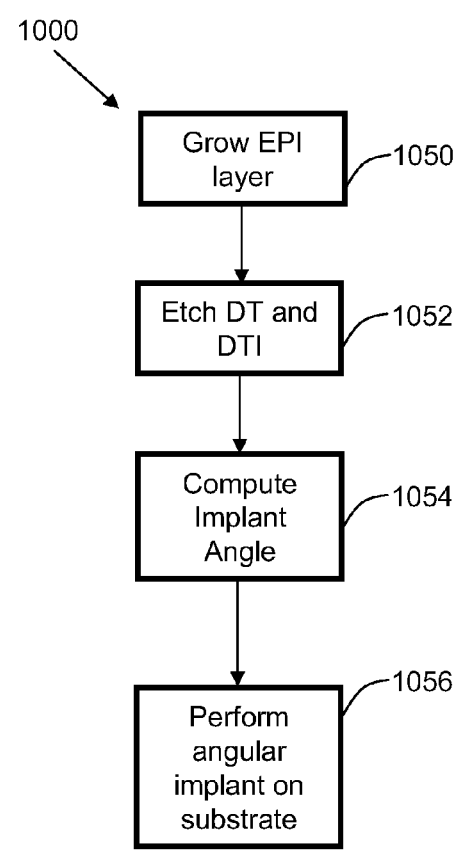

FIG. 10 shows a flowchart indicating process steps for carrying out an alternate embodiment of the present invention. At process step 1050, an EPI layer is grown on a silicon substrate. At process step 1052, the DT and DTI are formed via etch. In one embodiment, a reactive ion etch (RIE) tool is used to perform the etch. In process step 1054, the implant angle is computed. In one embodiment, the implant angle is computed by taking the a tan of the ratio of the width of the deep trench to the thickness of the nitride layer and mask layer (refer to FIGS. 6-8 and corresponding description). In process step 1056, the angular implant is performed.

The remaining process steps to complete the fabrication of the integrated circuit are in accordance with conventional methods known in the art. As can now be appreciated, embodiments of the present invention provide an improved structure and method for fabricating a trench capacitor.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for fabricating a trench capacitor, comprising the steps of:
   growing an epitaxial layer on a silicon substrate;
   forming a BOX layer above the epitaxial layer;
   forming a SOI layer above the BOX layer;
   depositing a nitride layer above the SOI layer;
   depositing a mask layer above the nitride layer;
   etching a deep trench within the epitaxial layer; and
   etching a bounded deep trench isolation moat within the epitaxial layer, wherein the base of the deep trench isolation moat extends into the epitaxial layer, and extends into the silicon substrate, wherein a first N doped region of the epitaxial layer is formed within the bounded deep trench isolation moat, and a second N doped region of the epitaxial layer is formed outside the bounded deep trench isolation moat, wherein the deep trench is within the bounded deep trench isolation moat, and wherein the width of the deep trench isolation moat is at least one order of magnitude larger than the width of the deep trench.

2. The method of claim 1, further comprising the steps of:
   depositing a mask layer over the first N doped region; and
   implanting the deep trench isolation area with P dopants.

3. The method of claim 1, further comprising the steps of:
   selecting an implant angle; and
   performing an implant using the selected implant angle.

4. The method of claim 3, wherein the step of selecting an implant angle comprises selecting an implant angle ranging from about 19 degrees to about 85 degrees.

5. The method of claim 4, wherein the step of selecting an implant angle comprises selecting an implant angle ranging from about 20 degrees to about 25 degrees.

6. The method of claim 3, wherein the step of selecting an implant angle comprises computing an implant angle by calculating the inverse tangent of the ratio of the width of the deep trench to the combined thickness of the nitride layer and the mask layer.

7. The method of claim 1, wherein the step of growing an epitaxial layer on a silicon substrate comprises growing an epitaxial layer with a thickness ranging from about 3 micrometers to about 5 micrometers.

8. The method of claim 1, wherein the step of forming a BOX layer above the epitaxial layer comprises forming a BOX layer with a thickness ranging from about 100 nanometers to about 200 nanometers.

9. The method of claim 1, wherein the step of forming a SOI layer above the BOX layer comprises forming a SOI layer with a thickness ranging from about 50 nanometers to about 100 nanometers.

10. The method of claim 1, wherein the step of etching a deep trench within the epitaxial layer comprises etching a deep trench with a width ranging from about 80 nanometers to about 120 nanometers, and a depth of at least 3 micrometers.

11. The method of claim 1, wherein the step of etching a deep trench isolation area within the epitaxial layer comprises etching a deep trench isolation area with a width of at least 1 micrometer, and a depth of at least 4 micrometers.

12. The method of claim 1, wherein the step of depositing a nitride layer above the SOI layer comprises depositing a nitride layer with a thickness ranging from about 100 nanometers to about 150 nanometers.

13. The method of claim 1, wherein the step of depositing a mask layer above the nitride layer comprises depositing a mask layer with a thickness ranging from about 150 nanometers to about 1500 nanometers.

14. The method of claim 2, wherein the step of depositing a mask layer over the first N doped region comprises depositing a high-density plasma oxide.

* * * * *